(12) United States Patent
Lin et al.

(10) Patent No.: US 9,899,513 B1
(45) Date of Patent: Feb. 20, 2018

(54) LATERAL DIFFUSED METAL OXIDE SEMICONDUCTOR TRANSISTOR AND MANUFACTURING METHOD THEREOF

(71) Applicant: MACRONIX International Co., Ltd., Hsinchu (TW)

(72) Inventors: Wei-Chih Lin, Hsinchu (TW); Chih-Chia Hsu, Hsinchu (TW); Yin-Fu Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/394,186

(22) Filed: Dec. 29, 2016

(51) Int. Cl.
*H01L 29/78* (2006.01)
*H01L 29/49* (2006.01)
*H01L 29/10* (2006.01)
*H01L 29/06* (2006.01)
*H01L 21/762* (2006.01)
*H01L 29/66* (2006.01)

(52) U.S. Cl.
CPC .... *H01L 29/7816* (2013.01); *H01L 21/76205* (2013.01); *H01L 29/0649* (2013.01); *H01L 29/1095* (2013.01); *H01L 29/4916* (2013.01); *H01L 29/66681* (2013.01)

(58) Field of Classification Search
CPC ................. H01L 29/66681; H01L 29/7816
See application file for complete search history.

(56) References Cited

U.S. PATENT DOCUMENTS

| | | | |
|---|---|---|---|
| 7,560,774 B1* | 7/2009 | Liu | H01L 21/823418 257/288 |
| 2010/0001345 A1* | 1/2010 | Furuhata | H01L 21/823807 257/343 |
| 2013/0140632 A1* | 6/2013 | Landgraf | H01L 21/02107 257/335 |
| 2017/0025532 A1* | 1/2017 | Mori | H01L 29/7823 |

* cited by examiner

*Primary Examiner* — Jae Lee
(74) *Attorney, Agent, or Firm* — J.C. Patents

(57) ABSTRACT

A lateral diffused metal oxide semiconductor (LDMOS) transistor and a manufacturing method thereof are provided. A deep well region is disposed in a substrate. An isolation structure is disposed in the substrate to define a first active area and a second active area. A well region is disposed in the deep well region in the first active area. A gate is disposed on the substrate in the first active area. A gate dielectric layer is disposed between the gate and the substrate. A first doped region is disposed in the well region in the first active area and located at one side of the gate. A second doped region is disposed in the deep well region in the second active area. A conductive structure is disposed on the isolation structure, surrounds the second doped region and is connected to the gate.

18 Claims, 2 Drawing Sheets

LATERAL DIFFUSED METAL OXIDE SEMICONDUCTOR TRANSISTOR AND MANUFACTURING METHOD THEREOF

BACKGROUND OF THE INVENTION

Field of Invention

The present invention relates to a semiconductor device and a manufacturing method thereof, and more particularly to a lateral diffused metal oxide semiconductor (LDMOS) transistor and a manufacturing method thereof.

Description of Related Art

LDMOS transistors, among the existing semiconductor devices, have been widely applied due to their properties such as high power, high voltage, high energy, high frequency, etc. When a LDMOS transistor is applied to a high voltage device, it has to be formed with a high breakdown voltage to prevent avalanche breakdown phenomenon from occurring in the device.

However, when the dimension of a device is continuously reduced, the junction avalanche breakdown phenomenon is easily generated in the region adjacent to the drain region of the LDMOS transistor due to the low junction breakdown voltage thereof. Therefore, how to effectively enhance the breakdown voltage of the device has been drawn high attention in the industry.

SUMMARY OF THE INVENTION

The present invention provides a LDMOS transistor, in which a conductive structure is disposed on an isolation structure adjacent to a drain region.

The present invention provides a manufacturing method of a LDMOS transistor, by which a conductive structure is formed on an isolation structure adjacent to a drain region.

The present invention provides a LDMOS transistor including a substrate, a deep well region, an isolation structure, a well region, a gate, a gate dielectric layer, a first doped region, a second doped region and a conductive structure. The deep well region is disposed in the substrate. The isolation structure is disposed in the substrate to define a first active area and a second active area. The well region is disposed is dispose deep well region in the first active area. The gate is disposed on the substrate in the first active area. The gate dielectric layer is disposed between the gate and the substrate. The first doped region is disposed in the well region in the first active area and located at one side of the gate. The second doped region is disposed in the deep well region in the second active area. The conductive structure is disposed on the isolation structure, surrounds the second doped region and is connected to the gate.

According to an embodiment of the present invention, a material of the conductive structure is the same as a material of the gate.

According to an embodiment of the present invention, a material of the conductive structure includes polysilicon.

According to an embodiment of the present invention, the conductive structure and the gate are connected to form a unity.

According to an embodiment of the present invention, a distance between the conductive structure and the second doped region ranges from 0.5 to 3 μm.

According to an embodiment of the present invention, the gate extends onto the isolation structure between the gate and the second doped region.

According to an embodiment of the present invention, the isolation structure includes a local oxidation of silicon (LOCOS) structure or a shallow trench isolation (STI) structure.

According to an embodiment of the present invention, the first doped region serves as a source region, and the second doped region serves as a drain region.

According to an embodiment of the present invention, a conductivity type of the deep well region is different from a conductivity type of the substrate.

The present invention provides a manufacturing method of a LDMOS transistor including the following steps. A deep well region is formed in a substrate. An isolation structure is formed in the substrate, wherein the isolation structure defines a first active area and a second active area. A well region is formed in the deep well region in the first active area. A gate is formed on the substrate in the first active area. A gate dielectric layer is formed between the gate and the substrate. A first doped region is formed in the deep region in the first active area and at one side of the gate. A second doped region is formed in the deep well region in the second active area. A conductive structure is formed on the isolation structure, wherein the conductive structure surrounds the second doped region and is connected to the gate.

According to an embodiment of the present invention, a material of the conductive structure is the same as a material of the gate.

According to an embodiment of the present invention, a material of the conductive structure includes polysilicon.

According to an embodiment of the present invention, the conductive structure and the gate are formed in the same step.

According to an embodiment of the present invention, a distance between the conductive structure and the second doped region ranges from 0.5 to 3 μm.

According to an embodiment of the present invention, the gate extends onto the isolation structure between the gate and the second doped region.

According to an embodiment of the present invention, the isolation structure includes a LOCOS structure or a STI structure.

According to an embodiment of the present invention, the first doped region serves as a source region, and the second doped region serves as a drain region.

According to an embodiment of the present invention, a conductivity type of the deep well region is different from a conductivity type of the substrate.

In view of the foregoing, in the present invention, a conductive structure is formed on an isolation structure and surrounds a drain region of a device. By such manner, when the device is operated, the conductive structure can effectively enhance the junction avalanche breakdown voltage between the deep well region and the substrate. Besides, the gate and the conductive structure are formed in the same step, so additional production cost and process step are not required.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
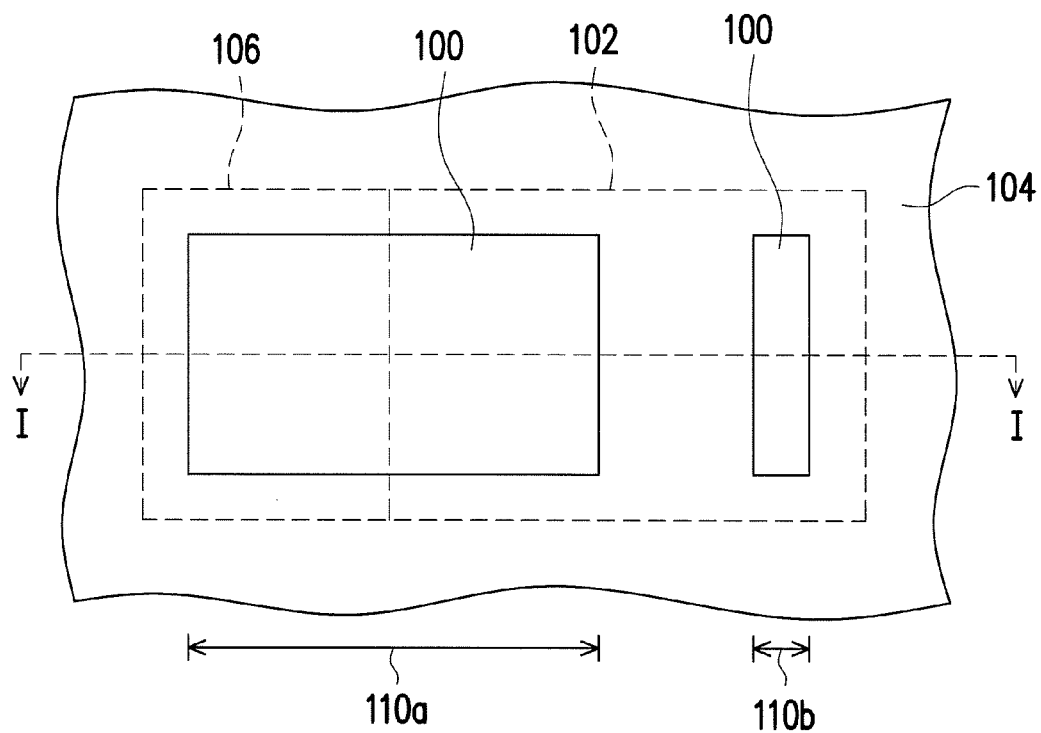
FIG. 1A to FIG. 1B are schematic top views of a manufacturing method of a LDMOS transistor according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
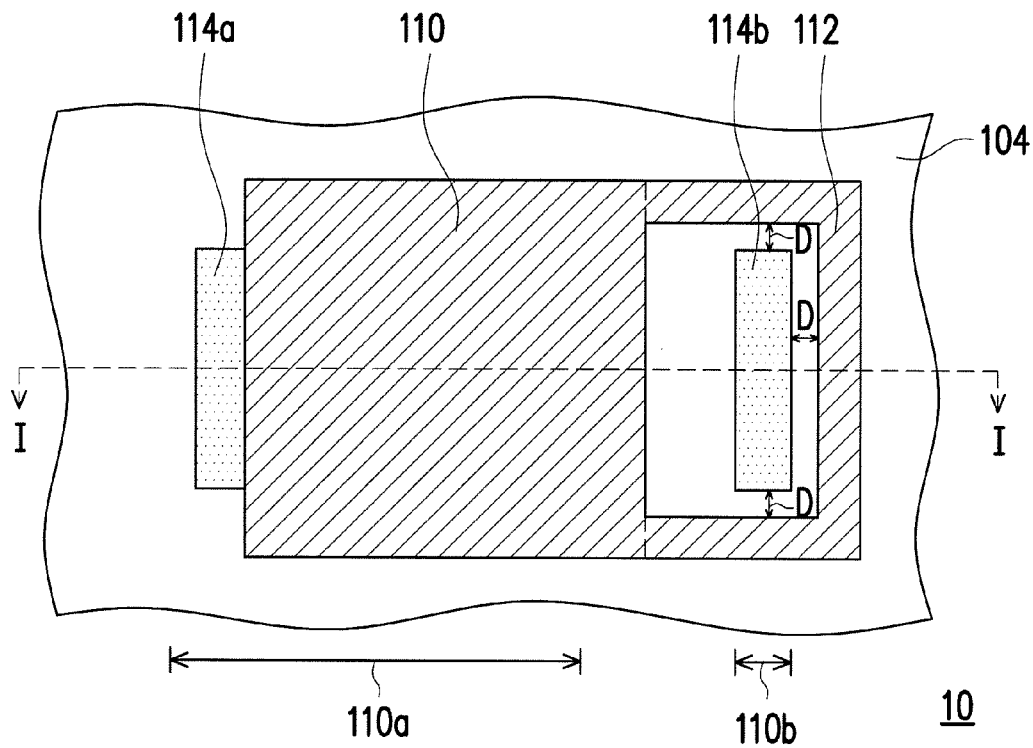
Figure 2A:
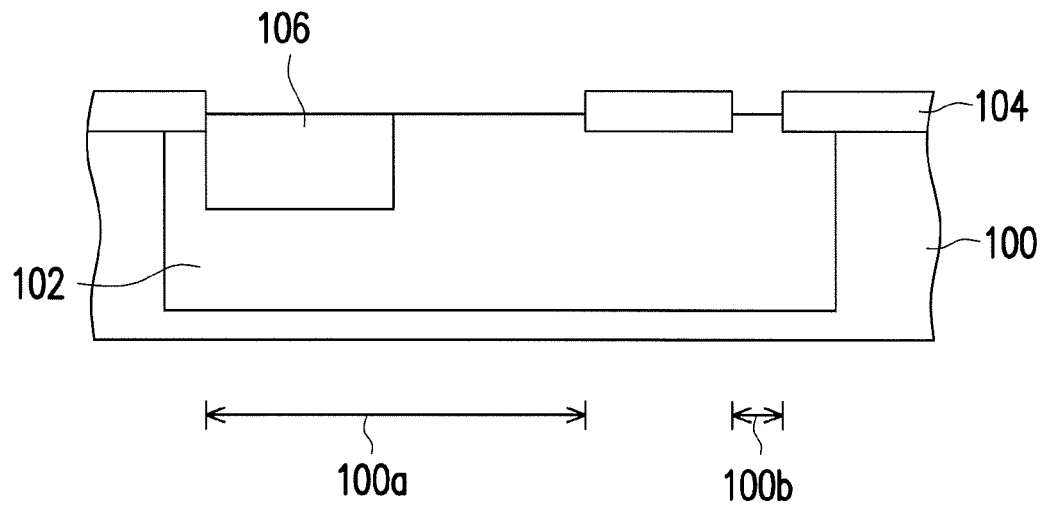
FIG. 2A to FIG. 2B are schematic cross-sectional views taken along the lines I-I in FIG. 1A and Figure B.
Figure 2B:
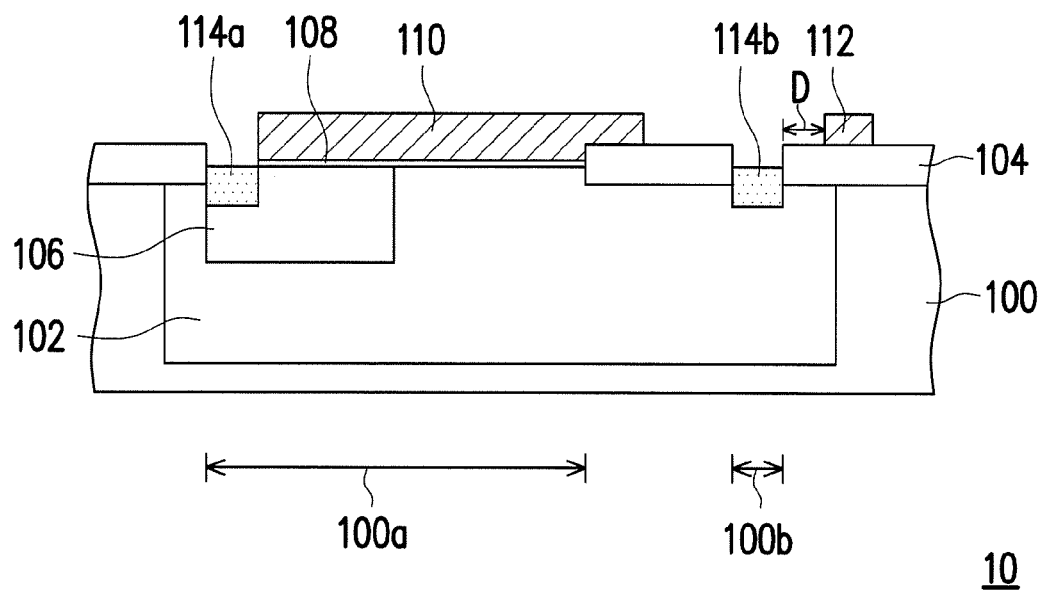

FIG. 1A to FIG. 1B are schematic top views of a manufacturing method of a LDMOS transistor according to an embodiment of the present invention. FIG. 2A to FIG. 2B are schematic cross-sectional views taken along the lines I-I in FIG. 1A and Figure B. In this embodiment, the conductivity type of an element is merely provided for illustration purposes, and is not construed as limiting the present invention. For example, the conductivity type of an element is p-type in this embodiment, but the conductivity type of the same element can be n-type in another embodiment.

Referring to FIG. 1A and FIG. 2A simultaneously, a deep well region 102 is formed in a substrate 100. The substrate 100 can be a p-type silicon substrate, and the deep well region 102 can be an n-type deep well region. The method of forming the deep well region 102 includes performing an ion implantation process to the substrate 100, so as to implant an n-type dopant (such as phosphorus or arsenic) into the substrate 100. Thereafter, an isolation structure 104 is formed in the substrate 100. In this embodiment, the isolation structure 104 can be a local oxidation of silicon (LOCOS) structure. However, the present invention is not limited thereto. In another embodiment, the isolation structure 104 can be a shallow trench isolation (STI) structure. In this embodiment, the isolation structure 104 in the substrate 100 defines an active area 100a and an active area 100b. The isolation structure 104 surrounds the active area 100a and the active area 100b. Afterwards, a well region 106 is formed in the deep well region 102 in the active area 100a. The well region 106 can be a p-type well region. The method of forming the well region 106 includes implanting a p-type dopant (e.g., boron) into the deep well region 102. Besides, the depth of the well region 106 is less than the depth of the deep well region 102.

Referring to FIG. 1B and FIG. 2B simultaneously, a gate dielectric layer 108 and a gate 110 are sequentially formed on the substrate 100 in the active area 100a. Besides, during the step of forming the gate 110, a conductive structure 112 is simultaneously formed on the isolation structure 104 around the active area 100b and is formed to connect the gate 110. The method of forming the gate dielectric layer 108, the gate 110 and the conductive structure 112 is described below. First, an oxidation process is performed to form an oxide layer on the substrate 100 in the active area 100a. Thereafter, a deposition process is performed to form a conductive layer on the substrate in the active area 100a and in the active area 100b, and the conductive layer covers the isolation structure 104. In this embodiment, the conductive layer can be a polysilicon layer. Afterwards, a patterning process is performed to partially remove the oxide layer and the conductive layer.

In this embodiment, after the patterning process, the formed gate 110 is located on the substrate 100 in active area 100a, and further extends onto the adjacent isolation structure 104. However, the present invention is not limited thereto. In another embodiment, the gate 110 can be formed on the substrate 100 merely in the active area 100a. Besides, the gate 110 and the conductive structure 112 are defined during the patterning process of the conductive layer, so the gate 110 and the conductive structure 112 are formed with the same material and the same thickness. In other words, in this embodiment, the conductive structure 112 can be formed on the isolation structure 104 around the active area 100b and formed to connect the gate 110 without an additional process step. Specifically, a single photomask can be used to simultaneously define the gate 110 and the conductive structure 112. Therefore, an extra production cost and complicated process step are not required.

Afterwards, a doped region 114a is formed in the substrate 100 aside the gate 110 in the active area 100a, and a doped region 114b is formed in the active area 100b. The LDMOS transistor 10 of this embodiment is thus completed. In this embodiment, the doped region 114a and the doped region 114b are n-type doped regions, both of which have a doping concentration greater than that of the deep well region 102 and have a depth less than that of the well region 106. The method of forming the doped region 114a and the doped region 114b includes performing an ion implantation process by using the gate 110 and the isolation structure 104 as a mask, so as to implant an n-type dopant (such as phosphorus or arsenic) into the substrate 100. The doped region 114a and the doped region 114b can respectively serve as a source region and a drain region of the LDMOS transistor 10.

In the LDMOS transistor 10, the conductive structure 112 is formed on the isolation structure 104 and surrounds the doped region 114b. Therefore, during the operation of the LDMOS transistor 10, the conductive structure 112 can effectively enhance the junction breakdown voltage between the deep well region 102 and the substrate 100. On the other hand, when the dimension of the device is continuously decreased, the junction breakdown voltage between the deep well region 102 and the substrate 100 can be effectively maintained at the required level by disposing the conductive structure 112 of the present invention.

In this embodiment, the distance D between the conductive structure 112 and the doped region 114b ranges from about 0.5 to 3 μm, as shown in FIG. 1B and FIG. 2B. In an embodiment, the doped region 114b can be, for example but not limited, a rectangular doped region, and the distance from the long side or short side of the rectangular doped region to the edge of the conductive structure 112 is the same, as shown in FIG. 1B. However, the present invention is not limited thereto. In another embodiment, the distance from the long side or short side of the rectangular doped region to the edge of the conductive structure 112 can be different upon the design requirements.

In some embodiments, the distance D between the conductive structure 112 and the doped region 114b can be, for example but not limited to, about 0.5, 1.0, 1.5, 2.0, 2.5, 3.0 μm, including any range between any two of the preceding values. When the distance D between the conductive structure 112 and the doped region 114b is greater than 3 μm, the junction breakdown voltage of the device cannot be effectively enhanced. When the distance D between the conductive structure 112 and the doped region 114b is less than 0.5 μm, the junction breakdown voltage between the deep well region 102 and the substrate 100 cannot be effectively enhanced. It is noted that the distance D between the conductive structure 112 and the doped region 114b is varied depending on the size of the device, the operation voltage, the dimension of the deep well region, etc. The mentioned values and ranges of the distance D are not construed as limiting the present invention.

The above embodiment in which the conductive structure 112 is formed on isolation structure 104 and surrounds the doped region 114b (e.g., drain region) of the LDMOS transistor 10 is provided for illustration purposes, and is not construed as limiting the present invention. It is appreciated by people having ordinary skill in the art that, the concept of the invention can be applied to various MOS transistor structures other than the LDMOS transistor 10. Specifically, a conductive structure is contemplated as falling within the scope of the present invention as long as this conductive structure is provided on an isolation structure and electrically coupled to a gate and therefore enhances the breakdown voltage.

Besides, in this embodiment, the conductive structure 112 and the gate 110 are made by the same material and connected each other to form a unity. However, the present invention is not limited thereto. In another embodiment, upon the actual requirements, the conductive structure 112 and gate 110 can be made by different materials or formed in different process steps.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A lateral diffused metal oxide semiconductor (LDMOS) transistor, comprising:
    a substrate;
    a deep well region, disposed in the substrate;
    an isolation structure, disposed in the substrate to define a first active area and a second active area;
    a well region, disposed in the deep well region in the first active area;
    a gate, disposed on the substrate in the first active area;
    a gate dielectric layer, disposed between the gate and the substrate;
    a first doped region, disposed in the well region in the first active area and located at one side of the gate;
    a second doped region, disposed in the deep well region in the second active area; and
    a conductive structure, disposed on the isolation structure, surrounding the second doped region and connected to the gate.

2. The LDMOS transistor of claim 1, wherein a material of the conductive structure is the same as a material of the gate.

3. The LDMOS transistor of claim 1, wherein a material of the conductive structure comprises polysilicon.

4. The LDMOS transistor of claim 1, wherein the conductive structure and the gate are connected to form a unity.

5. The LDMOS transistor of claim 1, wherein a distance between the conductive structure and the second doped region ranges from 0.5 to 3 µm.

6. The LDMOS transistor of claim 1, wherein the gate extends onto the isolation structure between the gate and the second doped region.

7. The LDMOS transistor of claim 1, wherein the isolation structure comprises a local oxidation of silicon (LOCOS) structure or a shallow trench isolation (STI) structure.

8. The LDMOS transistor of claim 1, wherein the first doped region serves as a source region, and the second doped region serves as a drain region.

9. The LDMOS transistor of claim 1, wherein a conductivity type of the deep well region is different from a conductivity type of the substrate.

10. A manufacturing method of a lateral diffused metal oxide semiconductor (LDMOS) transistor, comprising:
    forming a deep well region in a substrate;
    forming an isolation structure in the substrate, wherein the isolation structure defines a first active area and a second active area;
    forming a well region in the deep well region in the first active area;
    forming a gate on the substrate in the first active area;
    forming a gate dielectric layer between the gate and the substrate;
    forming a first doped region in the well region in the first active area and at one side of the gate;
    forming a second doped region in the deep well region in the second active area; and
    forming a conductive structure on the isolation structure, wherein the conductive structure surrounds the second doped region and is connected to the gate.

11. The manufacturing method of claim 10, wherein a material of the conductive structure is the same as a material of the gate.

12. The manufacturing method of claim 10, wherein a material of the conductive structure comprises polysilicon.

13. The manufacturing method of claim 10, wherein the conductive structure and the gate are formed in the same step.

14. The manufacturing method of claim 10, wherein a distance between the conductive structure and the second doped region ranges from 0.5 to 3 µm.

15. The manufacturing method of claim 10, wherein the gate extends onto the isolation structure between the gate and the second doped region.

16. The manufacturing method of claim 10, wherein the isolation structure comprises a local oxidation of silicon (LOCOS) structure or a shallow trench isolation (STI) structure.

17. The manufacturing method of claim 10, wherein the first doped region serves as a source region, and the second doped region serves as a drain region.

18. The manufacturing method of claim 10, wherein a conductivity type of the deep well region is different from a conductivity type of the substrate.

* * * * *